United States Patent
Moffatt

(10) Patent No.: US 9,123,527 B2
(45) Date of Patent: Sep. 1, 2015

(54) APPARATUS AND METHODS FOR PULSED PHOTO-EXCITED DEPOSITION AND ETCH

(71) Applicant: Applied Materials, Inc., Santa Clara, CA (US)

(72) Inventor: Stephen Moffatt, St. Brelade (JE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/186,783

(22) Filed: Feb. 21, 2014

(65) Prior Publication Data

US 2014/0263180 A1    Sep. 18, 2014

Related U.S. Application Data

(60) Provisional application No. 61/798,938, filed on Mar. 15, 2013.

(51) Int. Cl.
*C03C 15/00* (2006.01)
*H01L 21/00* (2006.01)
*C23C 16/00* (2006.01)

(52) U.S. Cl.
CPC ................ *H01L 21/00* (2013.01); *C23C 16/00* (2013.01)

(58) Field of Classification Search
CPC .............................. C23C 16/00; H01L 2/001
USPC ............ 216/62; 204/192.3, 192.17; 427/250, 427/569, 576
See application file for complete search history.

(56) References Cited

U.S. PATENT DOCUMENTS

| | | | |
|---|---|---|---|
| 4,435,445 A * | 3/1984 | Allred et al. ................... | 427/583 |
| 4,748,045 A | 5/1988 | Ehrlich et al. | |
| 4,816,294 A | 3/1989 | Tsuo et al. | |
| 5,508,067 A * | 4/1996 | Sato et al. ...................... | 427/579 |
| 6,770,144 B2 | 8/2004 | Raffin et al. | |
| 7,910,448 B2 | 3/2011 | Meunier-Beillard et al. | |
| 8,158,495 B2 | 4/2012 | Dutartre et al. | |

(Continued)

FOREIGN PATENT DOCUMENTS

JP    2009-052093 A    3/2009
KR    10-2010-0006009    1/2010

OTHER PUBLICATIONS

Delmadahl and Paetzel, "Laser Microprocessing", Jan. 2009, Wiley, pp. 24-28.*

(Continued)

*Primary Examiner* — Duy Deo
*Assistant Examiner* — Maki Angadi
(74) *Attorney, Agent, or Firm* — Patterson & Sheridan, LLP

(57) ABSTRACT

Embodiments of the invention provide methods for processing a substrate within a processing chamber. In one embodiment, the method comprises providing a precursor gas mixture into the processing chamber, the precursor gas mixture comprising a deposition precursor gas and an etch precursor gas, subjecting the precursor gas mixture to a thermal energy from a heat source to deposit a material layer on a surface of the substrate, wherein the thermal energy is below the minimum required for pyrolysis of the etch precursor gas, and after the material layer is formed on the surface of the substrate, subjecting the precursor gas mixture to a photon energy from a radiation source, the photon energy having a wavelength and a power level selected to promote photolytic dissociation of the etch precursor gas over the deposition precursor gas and etch a portion of the material layer from the surface of the substrate.

19 Claims, 2 Drawing Sheets

(56) References Cited

U.S. PATENT DOCUMENTS

| | | | |
|---|---|---|---|
| 8,297,225 | B2 | 10/2012 | Yin et al. |
| 2004/0018304 | A1* | 1/2004 | Chung et al. .................. 427/250 |
| 2006/0115933 | A1 | 6/2006 | Ye et al. |
| 2007/0254450 | A1 | 11/2007 | Dutartre et al. |

OTHER PUBLICATIONS

International Search Report and Written Opinion dated May 30, 2014 for Application No. PCT/US2014/017384.

* cited by examiner

APPARATUS AND METHODS FOR PULSED PHOTO-EXCITED DEPOSITION AND ETCH

CROSS-REFERENCE TO RELATED APPLICATIONS

This application claims benefit of U.S. provisional patent application Ser. No. 61/798,938, filed Mar. 15, 2013, which is herein incorporated by reference.

BACKGROUND

1. Field

Embodiments of the invention generally relate to methods of thermally processing substrates, and more particularly to methods for pulsed laser photo-excited etch and deposition of a layer on a substrate.

2. Description of the Related Art

Deposition and etch processes are commonly used in semiconductor processing to achieve selective deposition of materials in desired shapes and thickness. Typically, temperature, pressure, flow rates, and compositions of process gases are changed during the process to change from deposition to etch, or vice versa. Such changes are typically slow to occur and require transitions that result in intermittent chemistries and compositions. As demands for high-volume manufacturing of semiconductor devices increase, new methods and apparatus for fast, accurate deposition/etch processes are need.

SUMMARY OF THE INVENTION

Embodiments of the invention relate to methods for pulsed laser photo-excited etch and deposition of a layer on a substrate. In one embodiment, a method for processing a substrate within a processing chamber is disclosed. The method comprises providing a precursor gas mixture into the processing chamber, wherein the precursor comprises a deposition precursor gas and an etch precursor gas, maintaining the processing chamber at a temperature that is sufficient to thermally decompose substantially the deposition precursor gas, the temperature of the processing chamber is below the minimum required for pyrolysis of the etch precursor gas, and performing a deposition process and an etch process cycles alternatingly by turning on and off a radiation source emitting an electromagnetic radiation to the precursor gas mixture at or near the surface of the substrate.

In another embodiment, the method comprises providing a precursor gas mixture into the processing chamber, the precursor gas mixture comprising a deposition precursor gas and an etch precursor gas, subjecting the precursor gas mixture to a thermal energy from a heat source to deposit a material layer on a surface of the substrate, wherein the thermal energy is below the minimum required for pyrolysis of the etch precursor gas, and after the material layer is formed on the surface of the substrate, subjecting the precursor gas mixture to a photon energy from a radiation source, the photon energy having a wavelength and a power level selected to promote photolytic dissociation of the etch precursor gas over the deposition precursor gas and etch a portion of the material layer from the surface of the substrate.

In one another embodiment, the method comprises flowing a deposition precursor gas and an etch precursor gas concurrently into the processing chamber, maintaining the processing chamber at a constant temperature that is sufficient to thermally decompose substantially the deposition precursor gas, wherein the temperature of the processing chamber is below the minimum required for pyrolysis of the etch precursor gas, directing a first electromagnetic radiation from a radiation source toward the surface of the substrate, the electromagnetic radiation having a first wavelength and a first power level selected to promote pyrolysic dissociation of the deposition precursor gas, and directing a second electromagnetic radiation from the radiation source toward the surface of the substrate, the electromagnetic radiation having a second wavelength and a second power level selected to promote photolytic dissociation of the etch precursor gas.

In yet another embodiment, a substrate processing system is provided. The system comprises a processing chamber having a substrate support for supporting a substrate, a gas supply providing a precursor gas mixture from one or more gas sources into the processing chamber, wherein the precursor gas mixture comprises a deposition precursor gas and an etch precursor gas, a heating module heating the substrate and maintaining the processing chamber at a temperature that is sufficient to thermally decompose substantially the deposition precursor gas to deposit a material layer on the surface of the substrate, wherein the temperature of the processing chamber is below the minimum required for pyrolysis of the etch precursor gas, and a radiation source emitting an electromagnetic radiation to the precursor gas mixture at or near the surface of the substrate, the electromagnetic radiation having a wavelength and a power level selected to promote photolytic dissociation of the etch precursor gas over the deposition precursor gas and etch a portion of the material layer from the surface of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
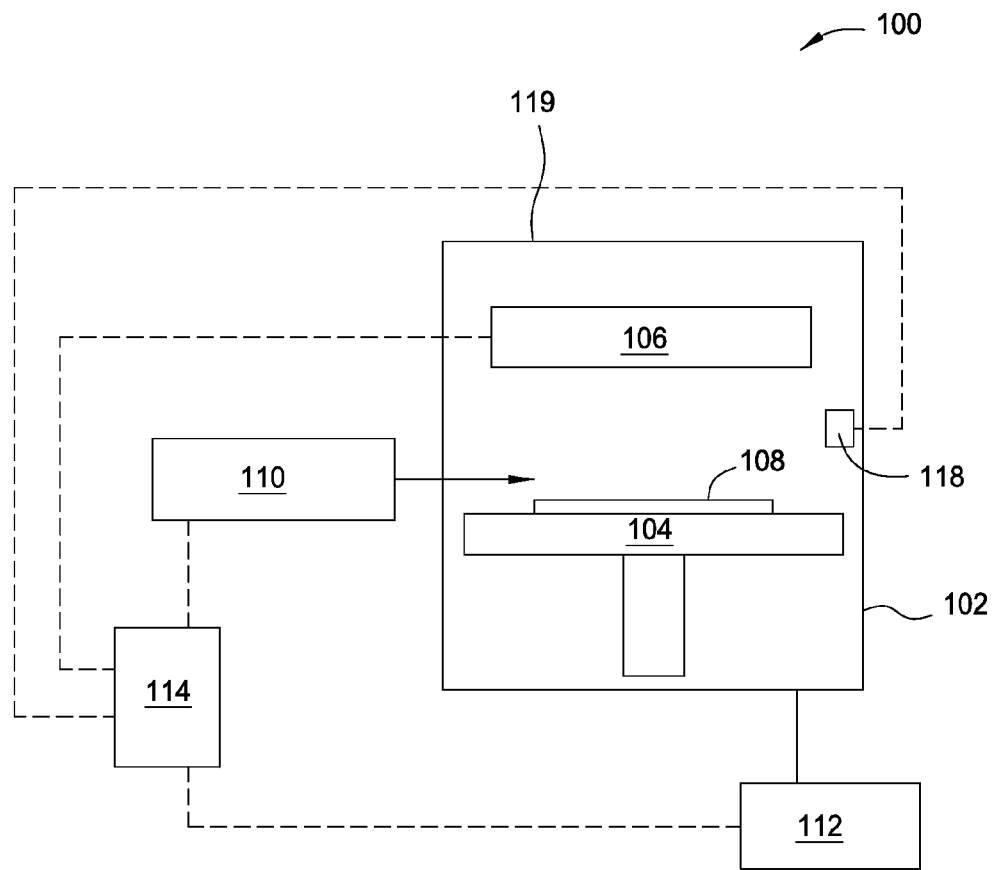
FIG. 1 illustrates a schematic sectional view of an exemplary thermal processing chamber that may be used to practice embodiments of the present invention.

FIG. 1 illustrates a schematic sectional view of an exemplary thermal processing chamber 100 that may be used to practice embodiments of the present invention. As will be discussed below, the thermal processing system 100 has a pulsed radiation source that can be used to rapidly, selectively assist or excite precursor gases in a low pressure chamber disposed within the thermal processing system 100 for either deposition or etch process without changing the precursor gases and related transitions, as would otherwise required by the conventional approach if the deposition and etch processes are involved within the same chamber. It is contemplated that the present invention is not limited to the configuration of the processing chamber 100 as shown since the concept of the present invention may also be utilized in other processing chambers such as a chemical vapor deposition (CVD) chamber, an atomic layer deposition (ALD) chamber, or an atomic layer epitaxy (ALE) chamber where etch-deposition cyclical process is needed. The concept of the invention may also benefit processes that may require at least one "LASE" application, e.g., applications using electromagnetic radiation such as laser ("L"), using electromagnetic radiation to activate or assist activation ("A"), using electromagnetic radiation to perform processes on surface or selective processing of an object ("S"), using electromagnetic radiation to perform epitaxy or etch process ("E"). The concept of the invention may also benefit processes that require use of plasma to help dissociate the etch precursor gas and/or the deposition precursor gas.

In the embodiment of FIG. 1, a low pressure chamber that may be used to perform a selective epitaxy process is shown and discussed for illustration purpose. In general, the thermal processing system 100 has a low pressure chamber 102 which includes a substrate support 104 and at least one heating module 106. The substrate support 104 is adapted to support a substrate 108 during film formation within the low pressure chamber 102. The low pressure chamber may be an epitaxy chamber, a CVD chamber, an etch chamber, or a deposition/etch chamber. The heating module 106 is adapted to heat the substrate 108 during epitaxial film formation within the low pressure chamber 102. It is contemplated that more than one heating module, and/or other heating module locations may be used. For example, the heating module may be positioned relatively below and adjacent to the substrate support 104 so that the substrate is heated from the backside of the substrate support 104. In either case, the heating module 106 may include, for example, a lamp array or any other suitable heating source and/or element. Additionally or alternatively, the substrate support 104 may be provided with a heating element (not shown) to aid in heating of the substrate. For example, the heating element may be a resistive heater embedded within the substrate support.

The thermal processing system 100 also includes a gas supply 110 and an exhaust system 112 coupled to the low pressure chamber 102, and a controller 114 coupled to the low pressure chamber 102, the gas supply 110 and/or the exhaust system 112. The gas supply 110 may include one or more sources and/or delivery systems for any precursor source, carrier, etchant, dopant or other gas employed by the low pressure chamber 102. While the gas supply 110 is shown to provide gases laterally from a side of the low pressure chamber 102, it is contemplated that the gas supply 110 may be disposed at any place, for example, over the substrate support 104. The exhaust system 112 may include any suitable system for exhausting waste gasses, reaction products, or the like from the low pressure chamber 102, and may include one or more vacuum pumps.

The thermal processing system 100 also includes a radiation source 118, which emits electromagnetic radiation with a wavelength and power selected to facilitate activation of gaseous precursor(s) within the low pressure chamber 102 for deposition and/or etching of a material layer on the surface of the substrate 108, as will be discussed below with respect to FIG. 2. The radiation source 118 may be positioned within the low pressure chamber 102 at any suitable place so that the light emitted from the radiation source 118 is able to illuminate substantially the entire gaseous precursor(s) at or near the top surface of the substrate 108. For example, the radiation source 118 may be disposed adjacent to a sidewall of the low pressure chamber 102, such as between the heating module 106 and the substrate 108 as shown in FIG. 1. Alternatively, the radiation source 118 may be disposed adjacent to a ceiling 119 outside the low pressure chamber 102 so that the top surface of the substrate 108 is uniformly illuminated by the light from top. In such a case, the radiation source 118 may be configured so that it is not obscured by the heating module 106, or the heating module 106 may be disposed at other suitable place as discussed earlier. It is contemplated that the radiation source 118 as discussed herein can be disposed within any other processing chambers such as a CVD chamber, an ALD chamber, an ALE chamber or a PVD chamber where etch-deposition cyclical processes may be needed.

The radiation source 118 may be a laser source, a bright light emitting diode (LED) source, a thermal source, or a combination thereof, and any of which may be delivered in a plurality of pulses or in a continuous wave mode. Other types of radiation sources such as an electron beam source, an ion beam source, or a microwave energy source are also contemplated. In one embodiment, the radiation source 118 uses a laser source. The lasers may be any type of laser such as fiber laser, gas laser, excimer laser, solid-state laser, semiconductor laser etc., which may be configurable to emit light at a single wavelength or at two or more wavelengths simultaneously.

While photolytic dissociation of precursors using UV energy is known, there has been limited industrial value due to the light source not being bright enough to provide photons that would overcome challenges of absorption length and coupling efficiency in the volumetric gas phase during the photodissociation process. A bright laser, such as a fiber laser, is advantageous since it is about $1\times10^5$ to $1\times10^8$ brighter compared to the conventional lamps such as a macular lamp. A bright laser light has been observed to be able to saturate the process precursor(s) with photon flux (i.e., all molecules within the process precursor from top to bottom and side to side of the process chamber is illuminated). Saturating the process precursor(s) with photon flux delivered at right power and wavelength (e.g., using a fiber laser at shorter wavelength, for example in the UV range of wavelength) is critical for the success of photo-excited deposition and etch process of the invention because the photon absorption of the precursors in a large volume can be increased, thus reducing the absorption length of the precursors correspondingly.

In cases where a laser source is used, the lasers may have wavelength between about 10 nm and about 2,000 nm. In various examples, the radiation source 118 may emit laser light in the ultraviolet (UV) range of wavelengths between about 10 nm and about 500 nm, for example between about 190 nm and 365 nm, such as, for example 193 nm, for example 248 nm, for example 266 nm, for example 355 nm, for example 365 nm, or example 420 nm. The lasers may be delivered at short pulses of high power laser radiation, for example in a duration less than about 100 nsec. The lasers may be configured to output continuous wave (CW) laser beam or quasi-CW laser beam at high power. The laser energy may range from essentially unimodal energy ($M^2 \approx 1$) to highly modal energy ($M^2 > 30$) having hundreds or thousands of spatial modes. Pulsed lasers may have pulse durations from the femtosecond range to the microsecond range. The lasers may be switched, for example by q-switching (passive or active), gain switching, or mode locking. A Pockels cell may also be used proximate the output of a laser to form pulses by interrupting a beam emitted by the laser. In general, lasers usable for pulsed laser processing are capable of producing pulses of laser radiation having energy content between about 1 mJ and about 10 J with duration between about 1 nsec and about 100 μsec.

In one example, the radiation source 118 uses a bundle of fiber lasers operating in the ultraviolet (UV) range of wavelengths as discussed above. In another example, the radiation source 118 uses a Nd:YAG laser. In latter case, the Nd:YAG laser may start with 1064 nm and frequency double to 532 nm, or frequency triple to 355 nm, depending upon the precursor gases to be illuminated. In one embodiment, four q-switched, frequency-doubled, Nd:YAG lasers emitting 532 nm laser energy between 30 MW and 50 MW in pulses ranging from about 5 nsec to about 30 nsec per pulse with $M^2$ between about 500 and about 1000 is used. In some cases, a fourth harmonic, or frequency quadrupled laser operating at 266 nm may be used for precursor gases having higher dissociation energy. The radiation source 118 may be configurable to deliver pulses of electromagnetic radiation at a desired power profile and uniformity, a desired duration, and a desired temporal shape. For example, the pulses of electromagnetic radiation may have a duration between about 1 nsec and about 1 msec, such as between about 10 nsec and 100 nsec, for example about 50 nsec. The energy delivered in each pulse may be between about 0.1 mJ/cm$^2$ and 1.0 J/cm$^2$, such as between about 0.2 mJ/cm$^2$ and about 0.7 mJ/cm$^2$, for example about 0.5 mJ/cm$^2$. The repetition rate of the energy pulse may be between about 1 kHz and about 1 MHz, such as between about 10 kHz and about 250 kHz, for example about 50 kHz to about 100 kHz.

The radiation source 118 may include a suitable optics to shape, focus, tailor and project the light into a desired shape of image, such as a square or a rectangular shape that is sufficient to cover a desired portion, or a majority portion of the substrate and/or the entire gaseous precursor(s) at or near the top surface of the substrate 108 to effect the deposition and etch processes. Alternatively, the optics may be separated from the radiation source 118 and positioned at any location between the heating module 106 and the substrate support 104 to project the light from the radiation source 118 into a desired shape of image that is sufficient to cover a majority portion of the substrate and/or the entire gaseous precursor(s) at or near the top surface of the substrate 108 to effect the deposition and etch processes. In cases where UV fiber lasers are used as the radiation source, the fiber lasers may be gathered into a head with a linear orientation, square orientation, or any desired shape, and the light from the fiber lasers may be passed through the optics such as a micro-lens array and/or projection lens to spread the UV light across the substrate 108 so that the entire substrate is irradiated uniformly. The output image may be adjusted depending upon the size of the substrate to be processed. If the light from the fiber lasers does not cover the entire substrate, the light source or the substrate may be stepped or scanned to expose the entire substrate.

The controller 114 may include one or more microprocessors and/or microcontrollers, dedicated hardware, a combination the same, etc., that may be employed to control operation of the low pressure chamber 102, the radiation source 118, the gas supply 110 and/or the exhaust system 112. In at least one embodiment, the controller 114 may be adapted to employ computer program code for controlling operation of the thermal processing system 100. For example, the controller 114 may perform or otherwise initiate one or more of the steps of any of the methods/processes described herein, including methods 200 of FIG. 2. Any computer program code that performs and/or initiates such steps may be embodied as a computer program product. Each computer program product described herein may be carried by a medium readable by a computer (e.g., a carrier wave signal, a floppy disc, a compact disc, a DVD, a hard drive, a random access memory, etc.).

Figure 2:
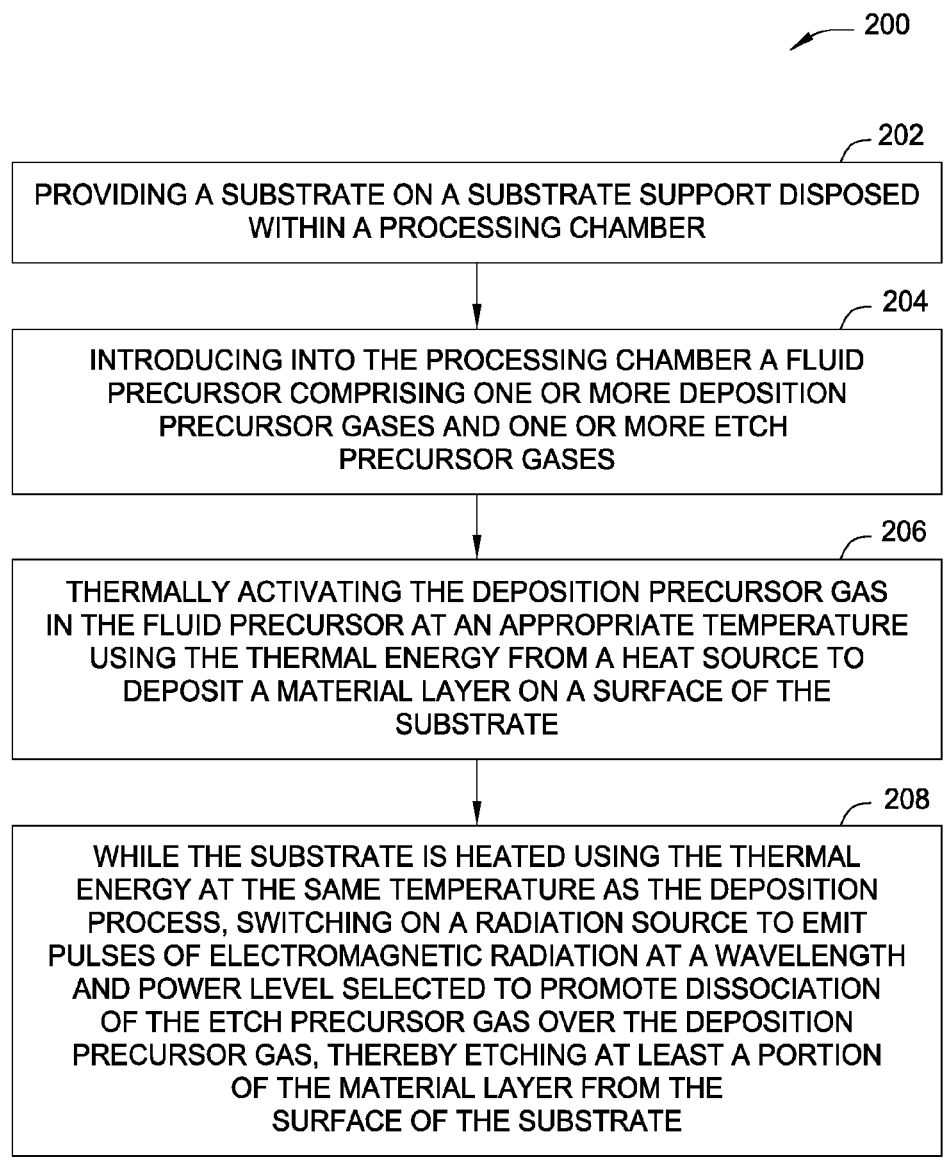
FIG. 2 illustrates an exemplary process of the present invention that may be used to selectively and epitaxially deposit a silicon-containing compound layer on a substrate through at least an etch-deposition cyclical process.

FIG. 2 illustrates a process according to one embodiment of the invention that may be used to selectively and epitaxially deposit a silicon-containing compound layer on a substrate through at least an etch-deposition cyclical process. The process of FIG. 2 may be equally applicable to formation of other material layer or material compound by any processing chamber, such as a chemical vapor deposition (CVD) chamber, an atomic layer deposition (ALD) chamber, an atomic layer epitaxy (ALE) chamber, or a physical vapor deposition (PVD) chamber where etch-deposition cyclical process may be needed. Exemplary material layers or material compounds may include, but are not limited to a doped or undoped semiconductor material or compound that is selected from a group consisting of silicon, germanium, $Si_xGe_{1-x}$ alloys, group III-V or group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof.

The process 200 begins at operation 202 by providing a substrate on a substrate support disposed within a processing chamber, for example the low pressure chamber 102 of FIG. 1. The substrate may be subjected to a pre-clean process to remove native oxide or other unwanted contamination prior to entering the processing chamber. For example, the substrate may be exposed to a remote plasma containing fluorine at a temperature below about 100° C. to form a sublimation layer from a native oxide layer on the substrate, and then the temperature of the substrate may be elevated above about 100° C. to remove the sublimation layer. The substrate may also, or alternately, be exposed to HF in solution, vapor, or plasma to remove oxides from the substrate.

In general, the term "substrate" as used herein refers to objects that can be formed from any material that has some natural electrical conducting ability or a material that can be modified to provide the ability to conduct electricity. A "substrate surface," as used herein, refers to any substrate surface upon which a material or energy process may be performed. It is contemplated that a substrate surface may contain features such as transistor junctions, via, contact, line, or any other interconnect facet, e.g., vertical or horizontal interconnect. In one embodiment illustrated in FIG. 2, the substrate surface may include more than one material, such as exposed monocrystalline silicon surface areas and features that are covered with dielectric material, such as oxide or nitride layers.

The processing chamber may be tailored to a predetermined temperature and pressure that are suitable for a process to be performed on the substrate surface. In various embodiments of the present invention, the processing chamber may be maintained at a consistent temperature throughout the etch-deposition cyclical process. As will be discussed in detail below, with the aid of photon energy from a radiation source to promote the etch process over the deposition process (or vice versa), the processing chamber may be switched rapidly between an etch mode and a deposition mode at lower temperature by turning on and off the radiation source. The thermal budget is therefore reduced without sacrificing growth rate of the material layer. In one example, the processing chamber may be maintained at a consistent temperature less than about 750° C., such as between about 250° C. and about 650° C., for example between about 300° C. and about 600° C. The appropriate temperature depends on the particular precursor(s) used to deposit and/or etch the material layer. The processing chamber may be maintained at a pressure from about 1 Torr to about 450 Torr, for example about 5 Torr to about 20 Torr for a deposition process, or about 250 Torr to about 400 Torr for an etch process.

At operation 204, a precursor gas is introduced into the processing chamber. The precursor gas may be a gaseous precursor. If desired, a liquid precursor may be additionally or alternatively used by dispersing liquids into a spinning substrate. The precursor gas may be introduced as a gas mixture of one or more deposition precursor gases and one or more etch precursor gases, if they are inert and chemically compatible to each other. Alternatively, one or more deposition precursor gases and one or more etch precursor gases may be introduced concurrently into the processing chamber through different gas inlets to prevent premature or undesired reaction of the precursor gases prior to entering the processing chamber.

In one embodiment where a doped silicon-containing compound layer, for example a doped silicon germanium carbon (SiGeC) is desired, the deposition precursor gas may contain a silicon source (e.g., silane), a carrier gas (e.g., $N_2$), a germanium source (e.g., GeH4), and a carbon source (e.g., $SiH_3CH_3$). The deposition precursor gas may further contain a dopant compound (e.g., $PH_3$) to provide a source of a dopant. The etch precursor gas may contain an etchant (e.g., $Cl_2$ or HCl). If the etch precursor gas is introduced separately from the deposition precursor gas, a carrier gas such as $N_2$ may be flowed concurrently with the etch precursor gas. Chlorine may enhance selective epitaxial growth process. Therefore in some cases where HCl is used as etch precursor gas, chlorine or chlorine-based gas may be additionally flowed into the processing chamber to enhance the selective epitaxial growth process. In the embodiment as described here, by exposing the substrate to reactive Cl species the reactive Cl species will react with the growing film to form volatile $SiCl_4$ and $GeCl_4$ species that etch the film. In practice, the etch rate of the film that is deposited on the surrounding materials is much faster than the etch rate of the film that is growing epitaxially on the exposed monocrystalline silicon. These two mechanisms combine to yield a desired epitaxial film on the exposed monocrystalline silicon and little or no film on the surrounding materials.

At operation 206, the molecules in the deposition precursor gas is thermally activated at an appropriate temperature using the thermal energy from a heat source (e.g., the heating module 106 and/or substrate support 104 of FIG. 1) to react and epitaxially deposit a doped silicon-containing compound layer, for example a doped SiGeC compound on the substrate surface. For a substrate surface including exposed monocrystalline silicon surface areas and features that are covered with dielectric material, the epitaxial layer of doped SiGeC compound is formed on the monocrystalline surface of the substrate while an amorphous or polycrystalline layer of doped SiGeC compound is formed on features of the substrate that are covered with dielectric material. While the deposition precursor gas is activated during operation 206, the thermal energy from the heat source is below the minimum required for pyrolysis of the etch precursor gas. Therefore, the thermal energy alone may not activate molecules in the etch precursor gas. For example, silane may be thermally decomposed at about 500° C., while chloride ($Cl_2$) requires an activation temperature of about 600° C. to act as an effective etchant.

At operation 208, while the substrate is heated using the thermal energy at the same temperature as the deposition process, a radiation source (e.g., the radiation source 118 of FIG. 1) is switched on to emit pulsed or continuous electromagnetic radiation at a wavelength and power level selected to promote or activate some or most molecules in the etch precursor gas. The electromagnetic radiation is emitted in a way such that all molecules of the deposition precursor gas and molecules of etch precursor gas within the processing chamber, from top to bottom and side to side, are saturated with radiation flux. If desired, the radiation source may be used with optics that shape the electromagnetic radiation into a desired image shape covering the etch and deposition precursor gases at or near the entire substrate surface, or the optics may spread the electromagnetic radiation across the etch and deposition precursor gases at or near the entire substrate surface so that the entire substrate surface is irradiated uniformly.

The photon energy of the radiation source may be below the minimum required for photodissociation of the etch precursor gas (in the absence of heat). However, the radiation source should be bright enough that provides an abundance of photons with sufficient power and intensity (i.e., photons are energetic enough to break the bonds in the precursor gas) that would significantly decrease the absorption length of precursors when present in a large volume. In other words, even though the radiation energy is delivered at a wavelength off the peak wavelengths for dissociation of the etch precursor gas such as chlorine (180 nm-200 nm), or in some situations the photon energy of the radiation source may not sufficiently enough to photodissociate whole volume of molecules in the etch precursor gas within the processing chamber, a bright radiation source would still be able to provide a number of photons that may be 5 or 10 times more than required for effective photodissociation of whole volume of molecules in the precursor gas. Exemplary radiation sources are discussed above. One useful radiation source, for a process at any given pressure of, for example about 1 Torr to about 450 Torr, may be a UV fiber laser emitted at 355 nm wavelength and power density between about 0.1 $mJ/cm^2$ and about 0.7 $mJ/cm^2$. Such a UV fiber laser (or other radiation source with the light characteristics as discussed previously) is believed to be able to photolysicly dissociate most of the precursor gases that are commonly used in an epitaxy process.

Alternatively, the photon energy of the radiation source alone may be sufficient to photolytically dissociate the molecules of the etch precursor gas. In either case, the combination of photon energy and thermal energy may cause the deposition reaction and etch reaction to occur simultaneously with relatively different reaction rates. For example, the etch reaction may occur faster than the deposition reaction.

Various approaches may be adapted to cause the etch reaction to occur faster than the deposition reaction. One possible way is to manipulate the etch precursor gas and/or the deposition precursor gas such that the dissociated species of the etch precursor gas are more sensitive or responsive to the electromagnetic radiation at a particular wavelength than that of the deposition precursor gas in the processing chamber. For example, UV radiation at a wavelength of 355 nm (corresponds to 3.50 eV) may be adequate to break bonds of $Cl_2$ (bond dissociation energy=2.48 eV) in the etch precursor gas but may not enough to break certain bonds in $SiH_3CH_3$ (C—H bond energy=4.26 eV) in the deposition precursor gas. Therefore, the etch precursor gas is photolytically dissociated at a faster reaction rate than the deposition precursor gas. The wavelength of the electromagnetic radiation may be selected such that the photon energy is sufficiently to dissociate only, or substantially the molecules of the etch precursor gas. In any case, while molecules of both the etch precursor gas and deposition precursor gas receive photon energy from the radiation source and thermal energy from the heating module and/or substrate support, the etch reaction becomes dominant at the selected wavelength of the electromagnetic energy during operation 208.

In some cases, for example in a selective epitaxial process embodiment, the amorphous or polycrystalline layer of doped SiGeC compound deposited on the features of the substrate that are covered with dielectric material is simply etched at a faster rate than the epitaxial layer of doped SiGeC compound deposited on the monocrystalline surface of the substrate. The net result of the deposition and etching processes forms epitaxially grown doped silicon germanium carbon on the monocrystalline silicon surface while minimizing growth, if any, of amorphous or polycrystalline doped silicon germanium carbon on the features covered with dielectric material.

The radiation source may be any type of laser as discussed above with respect to FIG. 1. In one embodiment, the radiation source is a bundle of fiber lasers operating in the wavelength range of about 190 nm and about 420 nm, for example about 355 nm or 365 nm. To effect the etching reaction, the electromagnetic radiation may be delivered at an average intensity between about 0.1 mJ/cm$^2$ and about 1.0 J/cm$^2$, such as 0.5 mJ/cm$^2$ in short pulses of duration between about 1 nsec and about 100 nsec, such as between about 5 nsec and about 50 nsec, for example about 10 nsec. A plurality of such pulses may be applied to the etch precursor gas and the deposition precursor gas, with a duration between the pulses between about 500 nsec and about 1 msec, such as between about 1 μsec and about 500 μsec, for example about 100 μsec.

A cycle of the deposition process as discussed in operation 206 and the etch process as discussed in operation 208 may be repeated as needed until a desired thickness of a doped silicon-containing compound layer, for example the doped SiGeC compound, is formed on the substrate surface. Particularly, the doped silicon-containing compound layer can be deposited at a high growth rate using one gas mixture (or both deposition precursor gas and etch precursor gas co-existed in the processing chamber) at lower temperature by turning on and off the radiation source to rapidly switch the process between an etch mode (operation 208) and a deposition mode (operation 206), without the need of long temperature ramp-up transition step and the precursor gas change step for deposition/etch process, as would otherwise be required by the conventional approach if the deposition and etch processes are involved within the same chamber.

While the discussion above mainly relates to photodissociation of volumetric gaseous interaction for deposition of a material layer on the substrate, it is contemplated that the photon energy of the radiation source and the precursor gas may be selected such that the photons are reacting primarily with the substrate surface, or the precursor gas (either deposition precursor gas or etch precursor gas as discussed above), or both. In one example, the photon energy may be delivered at a wavelength that has a low or zero attenuation in precursor gas (i.e., the light has no coupling to the precursor gas or saying differently the precursor gas is completely transparent to the light) and a high attenuation in the substrate, or vice versa. When the photon energy has little or no coupling to the precursor gas, most of the photon energy will be absorbed directly by the surface of the substrate and therefore a desired reaction is obtained at the substrate surface.

Other variations of the invention are contemplated to enable rapid film formation at lower temperature using one gas mixture of deposition precursor gas and etch precursor gas (or both deposition precursor gas and etch precursor gas co-existed in the processing chamber) for etch-deposition cyclical process. For example, the processing chamber may be maintained at a constant temperature between a desired temperature range that is sufficient for pyrolysis of the etch precursor gas or the deposition pecursor gas, with the radiation source being turned on all the time during the deposition and etch processes. In one embodiment, the electromagnetic radiation of the radiation source may be selected at a first wavelength for a deposition mode that is only effective for photodissociation of the deposition precursor gas, or is effective to promote photodissociation of the deposition precursor gas over the etch precursor gas. The electromagnetic radiation of the radiation source is then switched to an etch mode at a second wavelength that is different from the first wavelength and is only effective for photodissociation of the etch precursor gas, or is effective to promote photodissociation of the etch precursor gas over the deposition precursor gas. In this example, two or more radiation sources can be used to enable emitting electromagnetic radiation at two different wavelengths sequentially or simultaneously. If desired, the electromagnetic radiation may be delivered at a higher power level to promote the etch process over the deposition process (or the other way around). In such a case, the electromagnetic radiation may be delivered at a power level of at least 1 milliWatts (mW), such as about 10 mW to about 100 kiloWatts (kW), for example about 1 kW to about 80 kW, depending upon the precursor gas to be dissociated.

In another embodiment, the electromagnetic radiation of the radiation source may be kept the same during the deposition mode and etch mode, with the power level of the electromagnetic radiation being switched from low to high, or high to low, to promote the etch process over the deposition process (or the other way around). Therefore, while the combination of photon energy and thermal energy may cause the molecules of both the deposition precursor gas and etch precursor gas to decompose, the deposition/etch precursor gas, and the wavelength and power level of the electromagnetic radiation may be changed individually according to various embodiments of the invention discussed herein to promote the etch process over the deposition process (or vice versa) at a higher reaction rate and lower temperature by turning on and off the radiation source using one gas mixture (or both deposition precursor gas and etch precursor gas co-existed in the processing chamber).

While the foregoing is directed to embodiments of the present invention, other and further embodiments of the invention may be devised without departing from the basic scope thereof, and the scope thereof is determined by the claims that follow.

The invention claimed is:

1. A method for processing a substrate within a processing chamber, comprising:
   providing a precursor gas mixture into the processing chamber, wherein the precursor gas mixture comprises a deposition precursor gas and an etch precursor gas;
   subjecting the precursor gas mixture to a thermal energy from a heat source to deposit a first material layer on a surface of the substrate, wherein the thermal energy is below the minimum energy required for pyrolysis of the etch precursor gas in the precursor gas mixture; and
   after the first material layer is formed on the surface of the substrate, subjecting the precursor gas mixture to a photon energy from a radiation source, the photon energy and the thermal energy together resulting in at least photolytic dissociation of the etch precursor gas occurring faster than decomposition of the deposition precursor gas to etch a portion of the first material layer from the surface of the substrate.

2. The method of claim 1, further comprising:
   after the portion of the first material layer is etched from the surface of the substrate, turning off the radiation source;
   subjecting the precursor gas mixture to the thermal energy to deposit a second material layer on the surface of the substrate, wherein the thermal energy is below the minimum energy required for pyrolysis of the etch precursor gas in the precursor gas mixture; and
   after the second material layer is formed on the surface of the substrate, switching on the radiation source and subjecting the precursor gas mixture to the thermal energy and the photon energy from the radiation source to result in at least photolytic dissociation of the etch precursor gas occurring faster than decomposition of the deposition precursor gas to etch a portion of the second material layer from the surface of the substrate.

3. The method of claim 2, wherein the photon energy is sufficient to photolytically dissociate the etch precursor gas.

4. The method of claim 2, wherein the photon energy is below the minimum energy required for photodissociation of the etch precursor gas.

5. The method of claim 2, wherein the radiation source comprises a laser source, a bright light emitting diode (LED) source, or a thermal source.

6. The method of claim 5, wherein the laser source comprises a solid state laser, a fiber laser, an excimer laser, a carbon dioxide ($CO_2$) laser, or the like.

7. The method of claim 6, wherein the laser source is a fiber laser producing output in the ultraviolet (UV) wavelength range between about 10 nm and about 420 nm.

8. The method of claim 2, wherein the radiation source is configurable to deliver pulses of electromagnetic radiation having energy level between about 0.1 mJ/cm$^2$ and 1.0 J/cm$^2$ with duration between about 1 nsec and about 100 µsec.

9. The method of claim 2, wherein the first and second material layers comprise a doped or undoped semiconductor material or compound that is selected from a group consisting of silicon, germanium, $Si_xGe_{1-x}$ alloys, group III-V or group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof.

10. A method for processing a substrate within a processing chamber, comprising:
flowing a deposition precursor gas and an etch precursor gas into the processing chamber;
maintaining the processing chamber at a temperature that is sufficient to thermally decompose substantially the deposition precursor gas, wherein the temperature of the processing chamber is below the minimum temperature required for pyrolysis of the etch precursor gas;
directing a first electromagnetic radiation from a radiation source toward a surface of the substrate, the first electromagnetic radiation having a first wavelength and a first power level selected to promote pyrolytic dissociation of the deposition precursor gas over the etch precursor gas to deposit a material layer on the surface of the substrate; and
directing a second electromagnetic radiation from the radiation source toward the surface of the substrate, the electromagnetic radiation having a second wavelength and a second power level selected to promote photolytic dissociation of the etch precursor gas over the deposition precursor gas, wherein the second wavelength and the second power level are different from the first wavelength and the first power level.

11. The method of claim 10, wherein the radiation source comprises a laser source, a bright light emitting diode (LED) source, or a thermal source.

12. The method of claim 10, wherein the first wavelength and second wavelength are selected from a range between about 400 nm and about 1,000 nm or between about 190 nm and about 420 nm.

13. The method of claim 10, wherein the material layer comprises a doped or undoped semiconductor material or compound that is selected from a group consisting of silicon, germanium, $Si_xGe_{1-x}$ alloys, group III-V or group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof.

14. The method of claim 10, wherein the first electromagnetic radiation and second electromagnetic radiation are delivered in a plurality of pulses having energy level between about 0.1 mJ/cm$^2$ and 1.0 J/cm$^2$ with duration between about 1 nsec and about 100 µsec.

15. A method for processing a substrate within a processing chamber, comprising:
providing a precursor gas mixture into the processing chamber, wherein the precursor gas mixture comprises a deposition precursor gas and an etch precursor gas;
subjecting the precursor gas mixture to a thermal energy to deposit a first material layer on a surface of the substrate, wherein the thermal energy is below a minimum energy required for decomposition of the etch precursor gas in the precursor gas mixture;
after the first material layer is formed on the surface of the substrate, subjecting the precursor gas mixture to the thermal energy and a first photon energy from a radiation source to etch at least a portion of the first material layer from the surface of the substrate, wherein the first photon energy alone is below a minimum required for photolytic dissociation of the etch precursor gas, and combination of the first photon energy and the thermal energy results in at least photolytic dissociation of the etch precursor gas occurred faster than decomposition of the deposition precursor gas.

16. The method of claim 15, further comprising:
after at least the portion of the first material layer is etched from the surface of the substrate, turning off the radiation source;
subjecting the precursor gas mixture to the thermal energy to deposit a second material layer on the surface of the substrate, wherein the thermal energy is below the minimum energy required for pyrolysis of the etch precursor gas in the precursor gas mixture; and
after the second material layer is formed on the surface of the substrate, subjecting the precursor gas mixture to the thermal energy and a second photon energy from the radiation source to etch at least a portion of the second material layer from the surface of the substrate, wherein the second photon energy alone is below the minimum required for photolytic dissociation of the etch precursor gas, and combination of the second photon energy and the thermal energy results in at least photolytic dissociation of the etch precursor gas occurred faster than decomposition of the deposition precursor gas.

17. The method of claim 16, wherein the radiation source comprises a laser source, a bright light emitting diode (LED) source, or a thermal source.

18. The method of claim 17, wherein the radiation source is a laser source comprising a solid state laser, a fiber laser, an excimer laser, or a carbon dioxide ($CO_2$) laser.

19. The method of claim 18, wherein the radiation source is a fiber laser producing output in the ultraviolet (UV) wavelength range between about 10 nm and about 420 nm.

* * * * *